(12) United States Patent
Anzai

(10) Patent No.: US 6,639,860 B2
(45) Date of Patent: Oct. 28, 2003

(54) METHOD OF SCREENING NON-VOLATILE MEMORY DEVICES

(75) Inventor: Yasuhito Anzai, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/066,748

(22) Filed: Feb. 6, 2002

(65) Prior Publication Data

US 2003/0147294 A1 Aug. 7, 2003

(51) Int. Cl.$^7$ .............................................. G11C 29/00
(52) U.S. Cl. ...................... 365/201; 365/185.33; 438/17
(58) Field of Search ..................... 365/201–211, 185.33; 438/15, 17; 714/718; 702/82, 117

(56) References Cited

U.S. PATENT DOCUMENTS 5,581,510 A * 12/1996 Furusho et al. ............. 365/201
5,700,698 A * 12/1997 Barsan et al. ................. 438/17
6,075,724 A * 6/2000 Li et al. ...................... 365/201

FOREIGN PATENT DOCUMENTS

JP         07-045100    2/1995    ........... G11C/29/00

* cited by examiner

Primary Examiner—Son Mai
(74) Attorney, Agent, or Firm—Rabin & Berdo, PC

(57) ABSTRACT

A method of screening for a non-volatile memory device, including the steps of: controlling the temperature of a memory device at a first level to carry out a first stage of screening; and then, controlling the temperature of a memory device at a second level, which is different from the first level to carry out a second stage of screening.

8 Claims, 3 Drawing Sheets

METHOD OF SCREENING NON-VOLATILE MEMORY DEVICES

TECHNICAL FIELD OF THE INVENTION

This invention relates generally to screening of non-volatile memory devices, such as Flash memories.

BACKGROUND OF THE INVENTION

A screening test of non-volatile memory devices is commonly done at a high temperature in order to shorten the testing time. Once the test is completed, the memory devices that pass the test are marked and shipped to the customer. The invention relates to a screening test, which may be a part of all the tests for non-volatile memory devices, such as Flash memories. The test is used to remove or screen-out the die that has a defect or defects which occur during the fabrication of the memories.

Recently, it has been found that there is a plurality of defect modes in non-volatile memory devices. One mode of defect is a so-called "Hopping Conduction Model (HCM)". When traps are generated in an oxide layer and the barrier is lowered, a small amount of leak current is generated thereat. Such a leak current is called SILC (Stress Induced Leakage Current), which is considered to be generated based on PCAT (positive charge-assisted tunneling) and neutral traps. When a leak current is generated, a voltage Vt is decreased.

OBJECTS OF THE INVENTION

Accordingly, an object of the present invention is to provide a method in which hopping conduction model of defects can be screened out reliably.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a memory device is controlled in temperature at a first level to carry out a first stage of screening; and then, at a second level to carry out a second stage of screening. Preferably, the first level of temperature is lower than the second level of temperature. The memory device may be a flash memory. The first and second levels of temperatures may be in ranges of 85 to 150° C. and 200 to 300° C., respectively.

For example, a method of screening out a non-volatile memory device, according to the present invention including the steps of: providing a semiconductor wafer including a plurality of flash memory devices thereon; setting and leaving the wafer in a first thermostatic oven controlled in temperature in a range of 85 to 150° C. for a predetermined period of time; taking out the wafer from the first thermostatic oven; setting and leaving the wafer in a second thermostatic oven controlled in temperature at about 250° C. for a predetermined period of time; taking out the wafer from the second thermostatic oven; and cooling down the wafer at a room temperature.

On the other hand, according to a conventional method of screening non-volatile memory devices, the wafer is controlled in temperature at a high temperature, for example, around 250° C. Since the hopping conduction model is caused by traps in the oxide layer, the hopping conduction model is not generated after the traps are removed or escaped. When a screening test is carried out in an atmosphere of over 200° C., the traps generating the hopping conduction model are disappeared or removed before electrons of the memory cells are escaped.

DETAILED DISCLOSURE OF THE INVENTION

In the following detailed description of the preferred embodiments, reference is made to the accompanying drawings which form a part hereof, and in which is shown by way of illustration specific preferred embodiments in which the invention may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present invention. The following detailed description is, therefore, not to be taken in a limiting sense, and scope of the present invention is defined only by the appended claims.

Figure 1:
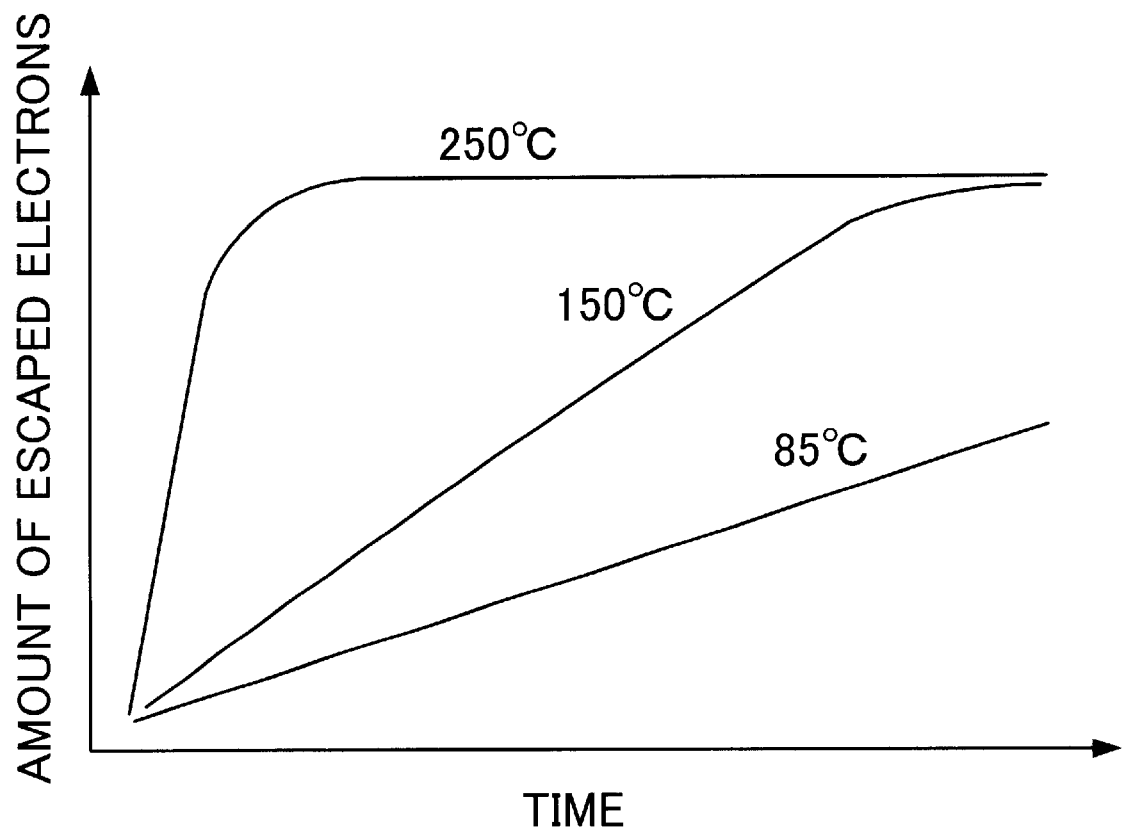
FIG. 1 is a graph showing the relation between time and the amount of escaped electrons.

FIG. 1 is a graph showing the relation between time and the amount of escaped electrons. As shown in FIG. 1, a large amount of injected electrons, which generate hopping conduction model of defects, escape or disappear during a high temperature screening, such as 250° C. As a result, it is difficult to screen out hopping conduction model of defects in a high temperature-screening. On the other hand, if the temperature of screening test is determined to be a lower temperature, such as 100° C., the screening test for data-hold errors takes many hours. Usually, data-holding defects are generated during a fabrication process of the device.

Figure 2:
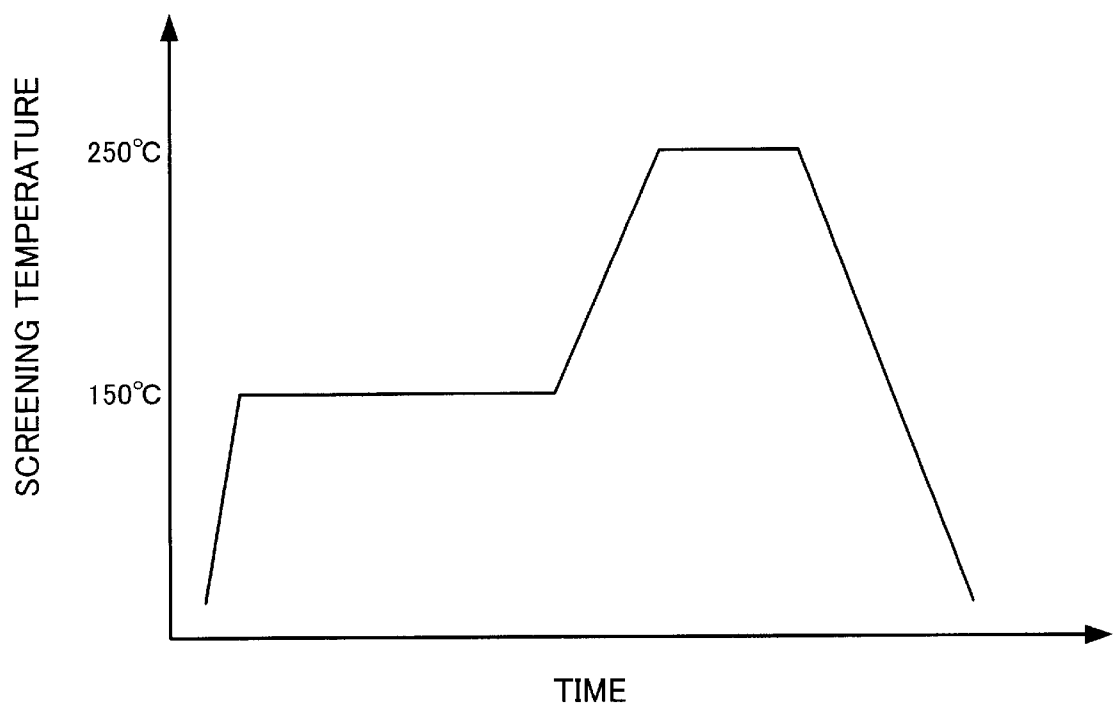
FIG. 2 is a graph showing the relation between time and screening temperatures according to a preferred embodiment of the present invention.
Figure 3:
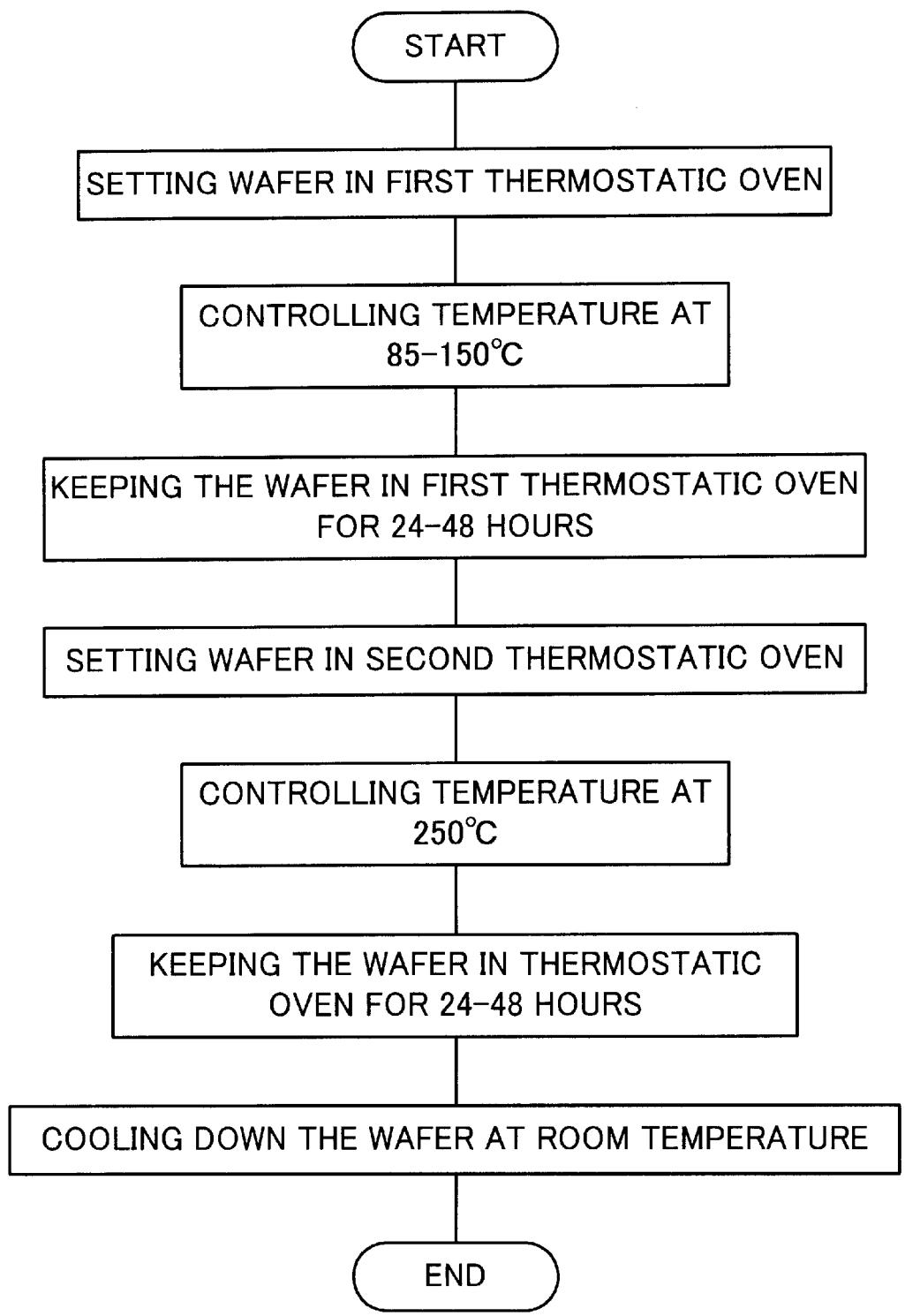
FIG. 3 is a flow chart showing screening steps according to the preferred embodiment.

FIG. 2 is a graph showing the relation between times and screening temperatures according to a preferred embodiment of the present invention. FIG. 3 is a flow chart showing screening steps according to the preferred embodiment. In this embodiment, a screening test of flash memory devices are carried out in accordance with the following steps:

(1) A semiconductor wafer on which a plurality of flash memory devices are formed is provided.

(2) The semiconductor wafer is set in a first thermostatic oven, which is controlled to have a temperature in a range of 85 to 150° C. The wafer is left in the first thermostatic oven for twenty-four to forty-eight hours. The treatment time can be changed in accordance with wafer processes, a level in the oxide layer at which traps are generated, and so on. The temperature of the first thermostatic oven can be controlled after the wafer is set therein. A first screening process is carried out for the flash memory devices formed on the wafer to screen out defects thereof, which are mostly caused by hopping conduction model.

(3) Next, the wafer is taken out of the first thermostatic oven and is set in a second thermostatic oven controlled to have a temperature of about 250° C. The wafer is left in the second thermostatic oven for twenty-four to forty-eight hours. The temperature of the second thermostatic oven can be controlled after the wafer is set therein. The treatment time can be changed in accordance with wafer processes, a level in the oxide layer at which traps are generated, and so on. A second screening process is carried out for the flash memory devices formed on the wafer to screen out defects thereof, which mostly caused by Arrhenius model.

(4) Subsequently, the wafer is taken out of the second thermostatic oven and is cooled down at the room temperature.

As described above, according to the embodiment, the screening process to flash memory devices on the semiconductor wafer is carried out at two different temperature conditions, so that defects mostly caused by hopping conduction model are screened out in the first stage of the screening process, then general defects mostly caused by manufacturing faults are screened out in the second stage of the screening process. The above mentioned "general defects" means defects which are independent from the temperature, and are generated in accordance with the Arrhenius model. The second stage of screening can be completed in a short period of time, because the memory devices are heated at a high temperature.

Although in the above described embodiment, two different screening modes are used, three or more different screening modes can be used. Further, one stage of screening test may be carried out in which the wafer is heated gradually low to high.

What is claimed is:

1. A method of screening a non-volatile memory device, comprising:

performing a first screening process to detect hopping conduction model defects controlling a temperature of the memory device at a first level; and performing a second screening process, after said first screening process, to detect Arrhenius model defects by controlling the temperature of the memory device at a second level.

2. A method according to claim 1, wherein the first level of temperature is lower than the second level of temperature.

3. A method according to claim 1, wherein the memory device is a flash memory.

4. A method according to claim 1, wherein the first level is lower than 150° C.

5. A method according to claim 4, wherein the first level is in a range of 70 to 150° C.

6. A method according to claim 5, wherein the second level of temperature is higher than 200° C.

7. A method according to claim 5, wherein the second level of temperature is around 250° C.

8. A method of screening out a non-volatile memory device, comprising:

providing a semiconductor wafer including a plurality of flash memory devices thereon;

setting and leaving the wafer in a first thermostatic oven controlled in temperature in a range of 85 to 150° C. for a predetermined period of time to carry out a first stage of screening;

taking out the wafer from the first thermostatic oven;

setting and leaving the wafer in a second thermostatic oven controlled in temperature at about 250° C. for a predetermined period of time to carry out a second stage of screening;

taking out the wafer from the second thermostatic oven; and cooling down the wafer at a room temperature.

* * * * *